US009940922B1

(12) United States Patent
Schissler et al.

(10) Patent No.: US 9,940,922 B1
(45) Date of Patent: Apr. 10, 2018

(54) METHODS, SYSTEMS, AND COMPUTER READABLE MEDIA FOR UTILIZING RAY-PARAMETERIZED REVERBERATION FILTERS TO FACILITATE INTERACTIVE SOUND RENDERING

(71) Applicant: The University of North Carolina at Chapel Hill, Chapel Hill, NC (US)

(72) Inventors: Carl Henry Schissler, Carrboro, NC (US); Dinesh Manocha, Chapel Hill, NC (US)

(73) Assignee: THE UNIVERSITY OF NORTH CAROLINA AT CHAPEL HILL, Chapel Hill, NC (US)

( * ) Notice: Subject to any disclaimer, the term of this patent is extended or adjusted under 35 U.S.C. 154(b) by 0 days.

(21) Appl. No.: 15/686,119

(22) Filed: Aug. 24, 2017

(51) Int. Cl.
*H03G 3/00* (2006.01)
*G10K 15/08* (2006.01)
*G10K 15/02* (2006.01)

(52) U.S. Cl.
CPC ............ *G10K 15/08* (2013.01); *G10K 15/02* (2013.01); *H04S 2400/11* (2013.01)

(58) Field of Classification Search
CPC . G10K 15/08; H04S 2400/11; H04S 2420/01; H04S 5/00; H04S 2420/07; G10H 2210/281; G10H 2210/291
See application file for complete search history.

(56) References Cited

U.S. PATENT DOCUMENTS 9,711,126 B2 7/2017 Mehra et al.

OTHER PUBLICATIONS

Schissler et al., "Efficient Construction of the Spatial Room Impulse Response," Virtual Reality (VR), IEEE, pp. 122-130 (Mar. 18-22, 2017).

Cao et al., "Interactive Sound Propagation with Bidirectional Path Tracing," Transactions on Graphics (TOG), vol. 35, Issue 6, pp. 1-11 (Dec. 5-8, 2016).

Schissler et al., "Efficient HRTF-based Spatial Audio for Area and Volumetric Sources," IEEE Transactions on Visualization and Computer Graphics, pp. 1-11 (2016).

Schissler et al., "Interactive Sound Propagation and Rendering for Large Multi-Source Scenes," ACM Transactions on Graphics, vol. 36, No. 1, pp. 1-12 (2016).

(Continued)

*Primary Examiner* — Duc Nguyen
*Assistant Examiner* — Kile Blair
(74) *Attorney, Agent, or Firm* — Jenkins, Wilson, Taylor & Hunt, P.A.

(57) ABSTRACT

Methods, systems, and computer readable media for utilizing ray-parameterized reverberation filters to facilitate interactive sound rendering are disclosed. According to one method, the method includes generating a sound propagation impulse response characterized by a plurality of predefined number of frequency bands and estimating a plurality of reverberation parameters for each of the predefined number of frequency bands of the impulse response. The method further includes utilizing the reverberation parameters to parameterize a plurality of reverberation filters in an artificial reverberator, rendering an audio output in a spherical harmonic (SH) domain that results from a mixing of a source audio and a reverberation signal that is produced from the artificial reverberator, and performing spatialization processing on the audio output.

20 Claims, 8 Drawing Sheets

(56) References Cited

OTHER PUBLICATIONS

Schissler et al., "Adaptive Impulse Response Modeling for Interactive Sound Propagation," Proceedings of the 20th ACM SIGGRAPH Symposium on Interactive 3D Graphics and Games, pp. 71-78 (Feb. 27-28, 2016).
Savioja et al., "Overview of geometrical room acoustic modeling techniques," J. Acoust. Soc. Am., vol. 138, No. 2, pp. 708-730 (Aug. 2015).
Romigh et al., "Efficient Real Spherical Harmonic Representation of Head-Related Transfer Functions," IEEE J. of Selected Topics in Signal Processing, vol. 9, No. 5, pp. 921-930 (Aug. 2015).
Kronlachne et al., "Spatial transformations for the Enhancement of Ambisonic Recordings," Proceedings of the 2nd International Conference on Spatial Audio, Erlangen, pp. 1-5 (2014).
Raghuvanshi et al., "Parametric Wave Field Coding for Precomputed Sound Propagation," ACM Transactions on Graphics, vol. 33, No. 4, Article 38, pp. 38:1-38:11 (Jul. 2014).
Sloan, "Efficient Spherical Harmonic Evaluation," Journal of Computer Graphics Techniques, vol. 2, No. 2, pp. 84-90 (2013).
Stephenson, "An Energetic Approach for the Simulation of Diffraction within Ray Tracing Based on the Uncertainty Relation," Acta Acustica united with Acustica vol. 96, pp. 516-535 (2010).
Anderson et al., "Adapting Artificial Reverberation Architectures for B-Format Signal Processing." Ambisonics Symposium, pp. 1-5 (Jun. 25-27, 2009).
Schröder et al., "A Fast Reverberation Estimator for Virtual Environments," Audio Engineering Society Conference: 30th International Conference: Intelligent Audio Environments, Audio Engineering Society, pp. 1-10 (Mar. 15-17, 2007).
Zahorik, "Assessing auditory distance perception using virtual acoustics," J. Acoust. Soc. Am., vol. 111, No. 4, pp. 1832-1846 (Apr. 2002).
Ivanic et al., "Rotation Matrices for Real Spherical Harmonics. Direct Determination by Recursion," J. Phys. Chem., vol. 100, No. 15, pp. 6342-6347 (1996).
Gardner, "Efficient Convolution Without Latency," Audio Engineering Society Convention 97. Audio Engineering Society, pp. 1-17 (Nov. 11, 1993).
Kuttruff, "Auralization of Impulse Responses Modeled on the Basis of Ray-Tracing Results," Journal of the Audio Engineering Society, vol. 41, No. 11, pp. 876-880 (Nov. 1993).
Moller, "Fundamentals of Binaural Technology," Applied Acoustics, 36(3/4), pp. 171-218 (1992).
Gerzon, "Periphony: With-Height Sound Reproduction," J. of the Audio Engineering Society, vol. 21, No. 1, pp. 2-8 (Jan.-Feb. 1973).
Schroeder, "Natural Sounding Artificial Reverberation," Journal of the Audio Engineering Society, vol. 10, No. 3, pp. 219-223 (Jul. 1962).
Antani, et al., "Aural proxies and Directionally-Varying Reverberation for Interactive Sound Propagation in Virtual Environments," Visualization and Computer Graphics, IEEE Transactions, vol. 19, Issue 4, pp. 567-575 (2013).
Ciskowski, et al., "Boundary Element Methods in Acoustics," Springer, Computational Mechanics Publications, pp. 13-60 (1991).
Embrechts, "Broad spectrum diffusion model for room acoustics ray-tracing algorithms," The Journal of the Acoustical Society of America, vol. 107, Issue 4, pp. 2068-2081 (2000).
Funkhouser, et al., "A beam tracing approach to acoustic modeling for interactive virtual environments," Proceedings of ACM SIGGRAPH, pp. 1-12, (1998).
Kuttruff, "Auralization of Impulse Responses Modeled on the Basis of Ray-Tracing Results," J. Audio eng. Soc., vol. 41, No. 11, pp. 876-880 (Nov. 1993).
Lentz, et al., "Virtual reality system with integrated sound field simulation and reproduction," EURASIP Journal of Advances in Signal Processing 2007 (January), pp. 1-19, (2007).
Mehra, et al., "Wave-based sound propagation in large open scenes using an equivalent source formulation," ACM Transaction on Graphics, vol. 32, Issue 2, pp. 1-12, (2013).
Muller-Tomfelde, "Time-Varying Filter in Non-Uniform Block Convolution," Proceedings of the COST G-6 Conference on Digital Audio Effects, pp. 1-5 (Dec. 2001).
Pulkki, "Virtual Sound Source Positioning using Vector Base Amplitude Panning," Journal of the Audio Engineering Society, vol. 45, Issue 6, pp. 456-466 (1997).
Rafaely, et al., "Interaural cross correlation in a sound field represented by sperical harmonies," The Journal of the Acoustical Society of America 127, 2, pp. 823-828 (2010).
Savioja, "Real-Time 3D Finite-Difference Time-Domain Simulation of Mid-Frequency Room Acoustics," 13th International Conference on Digital Audio Effects, pp. 1-8 (2010).
Schissler et al., "High-order diffraction and diffuse reflections for interactive sound propagation in large environments," ACM Transactions on Graphics (SIGGRAPH 2014), vol. 33, No. 4, p. 1-12 (2014).
Sloan, "Stupid Spherical Harmonics (SH) Tricks," Game Developers Conference, Microsoft Corporation, pp. 1-42 (Feb. 2008).
Tsingos, "Pre-computing geometry-based reverberation effects for games," 35th AES Conference on Audio for Games, pp. 1-10 (Feb. 2009).
Tsingos, et al., "Modeling acoustics in virtual environments using the uniform theory of diffraction," SIGGRAPH 2001, Computer Graphics Proceedings, pp. 1-9 (2001).
Valimaki et al., "Fifty Years of Artificial Reverberation," IEEE Transactions on Audio, Speech, and Language Processing, vol. 20, Issue 5, pp. 1421-1448 (2012).
Vorlander, "Simulation of the transient and steady-state sound propagation in rooms using a new combined ray-tracing/image-source algorithm," The Journal of the Acoustical Society of America, vol. 86, Issue 1, pp. 172-178 (1989).

300

| | Scene Complexity | | Propagation | | | | Auralization | |
|---|---|---|---|---|---|---|---|---|
| Scene | #Tris | #Sources | Ray Tracing (ms) | IR Analysis (ms) | Total (ms) | Speedup | % Max | Speedup |
| City | 1,001,860 | 13 | 6.85 | 0.23 | 7.08 | 9.3 | 11.6 | 1.9 |
| Hospital | 64,786 | 12 | 7.18 | 0.18 | 7.35 | 9.2 | 10.7 | 1.7 |
| Space Station | 49,258 | 23 | 12.75 | 0.45 | 13.20 | 10.2 | 20.2 | 1.6 |
| Sub Bay | 402,477 | 19 | 14.10 | 0.50 | 14.60 | 12.8 | 18.7 | 3.1 |
| Tuscany | 371,157 | 14 | 10.82 | 0.21 | 11.03 | 9.3 | 12.5 | 1.8 |
| Hospital (mobile) | 64,786 | 8 | 83.71 | 0.17 | 83.89 | 15.5 | 19.4 | 3.9 |
| Space Station (mobile) | 49,258 | 7 | 66.32 | 0.10 | 66.42 | 12.1 | 18.7 | 2.0 |

FIG. 3

METHODS, SYSTEMS, AND COMPUTER READABLE MEDIA FOR UTILIZING RAY-PARAMETERIZED REVERBERATION FILTERS TO FACILITATE INTERACTIVE SOUND RENDERING

TECHNICAL FIELD

The subject matter described herein relates to sound propagation within dynamic virtual or augmented reality environments containing one or more sound sources. More specifically, the subject matter relates to methods, systems, and computer readable media for utilizing ray-parameterized reverberation filters to facilitate interactive sound rendering.

BACKGROUND

At present, the most accurate sound rendering algorithms are based on a convolution-based sound rendering pipeline. However, low-latency convolution is computationally expensive, so these approaches are limited in terms of number of simultaneous sources that can be rendered. The convolution cost also increases considerably for long impulse responses are computed in reverberant environments. As a result, convolution based rendering pipelines are not practical on current low-power mobile devices.

Accordingly, there exists a need for methods, systems, and computer readable media for utilizing ray-parameterized reverberation filters to facilitate interactive sound rendering.

SUMMARY

Methods, systems, and computer readable media for utilizing ray-parameterized reverberation filters to facilitate interactive sound rendering are disclosed. According to one embodiment, the method includes generating a sound propagation impulse response characterized by a plurality of predefined number of frequency bands and estimating a plurality of reverberation parameters for each of the predefined number of frequency bands of the impulse response. The method further includes utilizing the reverberation parameters to parameterize a plurality of reverberation filters in an artificial reverberator, rendering an audio output in a spherical harmonic (SH) domain that results from a mixing of a source audio and a reverberation signal that is produced from the artificial reverberator, and performing spatialization processing on the audio output.

The subject matter described herein can be implemented in software in combination with hardware and/or firmware. For example, the subject matter described herein can be implemented in software executed by one or more processors. In one exemplary implementation, the subject matter described herein may be implemented using a non-transitory computer readable medium having stored thereon computer executable instructions that when executed by the processor of a computer control the computer to perform steps. Exemplary computer readable media suitable for implementing the subject matter described herein include non-transitory devices, such as disk memory devices, chip memory devices, programmable logic devices, and application specific integrated circuits. In addition, a computer readable medium that implements the subject matter described herein may be located on a single device or computing platform or may be distributed across multiple devices or computing platforms.

As used herein, the terms "node" and "host" refer to a physical computing platform or device including one or more processors and memory.

As used herein, the terms "function", "engine", and "module" refer to software in combination with hardware and/or firmware for implementing features described herein.

A number of mathematical symbols are presented below throughout the specification. The following table lists these symbols along with their respective associated meanings for ease of reference.

| Symbols | Meaning |
|---|---|
| $n$ | Spherical harmonic order |
| $N_\omega$ | Frequency band count |
| $\overline{\omega}$ | Frequency band |
| $\vec{x}$ | Direction toward source along propagation path |
| $x_{lm,i}$ | SH Distribution of sound for jth path |
| $X(\vec{x}, t)$ | Distribution of incoming sound at listener in the IR |
| $X_{lm}(t)$ | Spherical harmonk projection of $X(\vec{x}, t)$ |
| $X_{lm,\omega}(t)$ | $X_{lm}(t)$ for frequency band $\overline{\omega}$ |
| $I_\omega(t)$ | IR in intensity domain for band $\overline{\omega}$ |
| $s(t)$ | Anechoic audio emitted by source |
| $s_\omega(t)$ | Source audio filtered into frequency bands $\overline{\omega}$ |
| $q_{lm}(t)$ | Audio at listener position in SH domain |
| $H(\vec{x}, t)$ | Head-related transfer function |
| $h_{lm}(t)$ | HRIT projected into SH domain |
| $A(\vec{x})$ | Amplitud panning function |
| $A_{lm}$ | Amplitude panning function in SH domain |
| $\mathcal{J}(\mathcal{R})$ | SH rotation matrix for 3 × 3 matrix $\mathcal{R}$ |
| $\mathcal{R}L$ | 3 × 3 matrix for listener head orientation |
| $RT_{60}$ | Time for reverberation to decay by 60 dB |
| $g_{comb}^{i}$ | Feedback gain for ith recursive comb filter |
| $t_{comb}^{i}$ | Delay time for ith recursive comb filter |
| $g_{reverb,\omega}$ | Output gain of SH reverberator for band $\overline{\omega}$ |
| $t_{predelay}$ | TIMEdelay of reverb relative to t = 0 in IR |
| $D_\omega$ | SH directional loudness matrix |
| $\tau$ | Temporal coherence smoothing time (seconds) |

BRIEF DESCRIPTION OF THE DRAWINGS

Preferred embodiments of the subject matter described herein will now be explained with reference to the accompanying drawings, wherein like reference numerals represent like parts, of which:

FIG. 3 is a table illustrating results of an example sound rendering pipeline according to an embodiment of the subject matter described herein;

DETAILED DESCRIPTION

The subject matter described herein discloses methods, systems, and computer readable media for utilizing ray-parameterized reverberation filters to facilitate interactive sound rendering. In some embodiments, the disclosed subject matter includes a new sound rendering pipeline system that is able to generate plausible sound propagation effects for interactive dynamic scenes in a virtual or augmented reality environment. The disclosed sound rendering pipeline combines ray-tracing-based sound propagation with reverberation filters using robust automatic reverberation parameter estimation that is driven by impulse responses computed at a low sampling rate. The disclosed system also affords a unified spherical harmonic (SH) representation of directional sound in both the sound propagation and auralization modules and uses this formulation to perform a constant number of convolution operations for any number of sound sources while rendering spatial audio. In comparison to previous geometric acoustic methods, the disclosed subject matter achieves a speedup of over an order of magnitude while delivering similar audio to high-quality convolution rendering algorithms. As a result, this approach is the first capable of rendering plausible dynamic sound propagation effects on commodity smartphones and other low power user devices (e.g., user devices with limited processing capabilities and memory resources as compared to high power desktop and laptop computing devices). Although the sound rendering pipeline system comprising ray parameterized reverberator filters is ideally used by low power devices, high powered devices can also utilize the described ray parameterized reverberator filter processes without deviating from the scope of the present subject matter.

Reference will now be made in detail to exemplary embodiments of the subject matter described herein, examples of which are illustrated in the accompanying drawings. Wherever possible, the same reference numbers will be used throughout the drawings to refer to the same or like parts.

Figure 1:
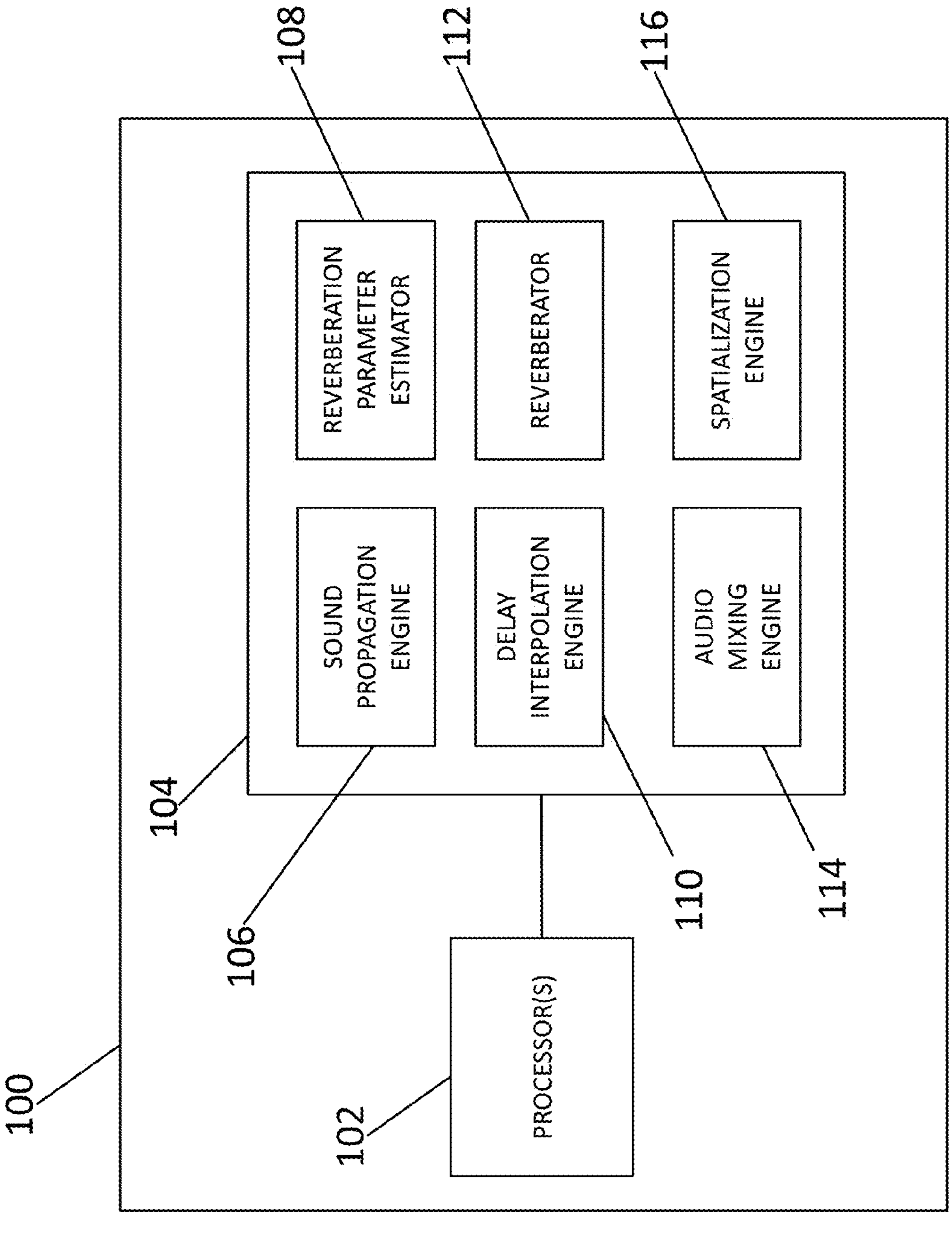
FIG. 1 is a block diagram illustrating an exemplary device for utilizing ray-parameterized reverberation filters to facilitate interactive sound rendering according to an embodiment of the subject matter described herein.

FIG. 1 is a block diagram illustrating an exemplary sound rendering device 100 for generating interactive sound propagation and utilizing ray-parameterized reverberation filters to facilitate interactive sound rendering in virtual reality (VR) or augmented reality (AR) environment scenes displayed by device 100. In some embodiments, sound rendering device 100 may comprise a low-power mobile user device, such as a smart phone or computing tablet.

In some embodiments, sound rendering device 100 may comprise a mobile computing platform device that includes one or more processors 102. In some embodiments, processor 102 may include a physical processor, a field-programmable gateway array (FPGA), an application-specific integrated circuit (ASIC) and/or any other like processor core. Processor 102 may include or access memory 104, which may be configured to store executable instructions or modules. Further, memory 104 may be any non-transitory computer readable medium and may be operative to be accessed by and/or communicate with one or more of processors 102. Memory 104 may include a sound propagation engine 106, a reverberation parameter estimator 108, a delay interpolation engine 110, an artificial reverberator 112, an audio mixing engine 114, and a spatialization engine 116. In some embodiments, each of components 106-116 includes software components stored in memory 104 and may be read and executed by processor(s) 102. It should also be noted that a sound rendering device 100 that implements the subject matter described herein may comprise a special purpose computing device that configured to utilize ray-parameterized reverberation filters to facilitate interactive sound rendering with limited processing, power (e.g., battery), and memory resources (as compared to a high power computing platform, e.g., desktop or laptop computer).

In some embodiments, sound propagation engine 106 receives scene information, listener location data, and source location data as input. For example, the location data for the audio source(s) and listener indicates that position of these entities within a virtual or augmented reality environment defined by the scene information. Sound propagation engine 106 uses geometric acoustic algorithms, like ray tracing or path tracing, to simulate how sound travels through the environment. Specifically, sound propagation engine 106 may be configured to use one or more geometric acoustic techniques for simulating sound propagation in one or more virtual or augmented reality environments. Geometric acoustic techniques typically address the sound propagation problem by using assuming sound travels like rays. As such, geometric acoustic algorithms utilized by sound propagation engine 106 may provide a sufficient approximation of sound propagation when the sound wave travels in free space or when interacting with objects in virtual environments. Sound propagation engine 106 is also configured to compute an estimated directional and frequency-dependent impulse response (IR) between the listener and each of the audio sources. Notably, the rays defined by the geometric acoustic algorithms, which are utilized by sound propagation engine 106 to very coarsely sample (e.g., sample rate of 100 Hz) the sound propagation rays. In some embodiments, the audio is sampled at a predefined number of frequency bands. Additional functionality of sound propagation engine 106 is disclosed below with regard to sound propagation engine 204 of a sound rendering pipeline system 200 depicted in FIG. 2. In some embodiments, sound propagation engine 106 is further configured to estimate early reflection data based on the aforementioned scene, the source location data, and the listener location data. Sound propagation engine 106 may subsequently provide the early reflection data to delay interpolation engine 110.

Once the impulse response is produced, sound propagation engine 106 forwards the impulse response and associated spherical harmonization coefficients to reverberation parameter estimator 108. In some embodiments, reverberation parameter estimator 108 receives and processes the impulse response from sound propagation engine 106 and derives a plurality of estimated reverberation parameters. For example, reverberation parameter estimator 108 processes the IR to estimate a reverberation time (e.g., $RT_{60}$) and a direct-to-reverberant (D/R) sound ratio for each frequency band of the IR. Once the reverberation parameters are generated, reverberation parameter estimator 108 it is configured to provide the reverberation parameter Data to reverberator 112. Additional functionality of reverberation parameter estimator 108 is described in greater detail below with regard to reverberation parameter estimator 206 of a sound rendering pipeline system 200 depicted in FIG. 2.

Sound rendering device 100 also includes a delay interpolation engine 110 that is configured to receive the source audio to be propagated within the AR or VR environment/scene as input. In some embodiments, delay interpolation engine 110 processes the source audio input to compute a reverberation predelay time that is correlated to the size of the environment. As indicated above, delay interpolation engine 110 receives early reflection data from sound propagation engine 106 that can be used with the source audio input to compute the aforementioned reverberation predelay. Once the predelay time is determined, source audio input read at the predelayed time is provided as input audio to reverberator 112. Additional functionality of delay interpolation engine 110 is described in greater detail below with regard to delay interpolation engine 210 of a sound rendering pipeline system 200 depicted in FIG. 2.

As indicated above, after the reverberation parameters are generated by reverberation parameter estimator 108, reverberation parameter estimator 108 supplies the parameters to reverberator 112. In some embodiments, these reverberation parameters are used to parameterize reverberator 112 (e.g., comb filters and or all pass filters included within reverberator 112. In some examples, reverberator 112 is an artificial reverberator that is configured to render a separate channel for each frequency band and SH coefficient, and uses spherical harmonic rotations in a comb-filter feedback path to mix the SH coefficients and produce a natural distribution of directivity for the reverberation decay. The output of reverberator 112 is a filtered audio output that provided to an audio mixing engine 114. Additional functionality of reverberator 112 is described in greater detail below with regard to reverberator 212 of a sound rendering pipeline system 200 depicted in FIG. 2.

Audio mixing engine 114 is configured to receive source audio output from delay interpolation engine 110 and audio output from reverberator 112. In some embodiments, the audio output from reverberator 112 is subjected to directivity processing prior to being received by audio mixing engine 114. After receiving the audio output from both delay interpolation engine 110 and reverberator 112, audio mixing engine 114 sums the two audio outputs to produce a mixed audio signal that is forwarded to spatialization engine 116. In some embodiments, the mixed audio signal is a broadband audio signal in the SH domain. Additional functionality of audio mixing engine 114 is described in greater detail below with regard to audio mixing engine 216 of a sound rendering pipeline system 200 depicted in FIG. 2.

As shown in FIG. 1, sound rendering device 100 may further include a spatialization engine 116. Notably, spatialization engine 116 is configured to receive the audio output from audio mixing engine 114 as input and apply for perform at least one spatialization process. For example, spatialization engine 116 may be configured to convolve the audio for all sources with a rotated version of the user's HRTF in the SH domain. After spatialization engine 116 performs the aforementioned convolution operation, a final audio output is provided to the listener. Alternatively, spatialization engine 116 may be configured to perform amplitude panning. Additional functionality of spatialization engine 116 is described in greater detail below with regard to spatialization engine 220 of a sound rendering pipeline system 200 depicted in FIG. 2.

At present, sound rendering is frequently used to increase the sense of realism in virtual reality (VR) and augmented reality (AR) applications. A recent trend has been to use mobile devices (e.g., Samsung Gear VR™ and Google Daydream-Ready Phones™) for VR. A key challenge is to generate realistic sound propagation effects in dynamic scenes on low-power devices of this kind. A major component of rendering plausible sound is the simulation of sound propagation within scenes of the virtual environment. When sound is emitted from an audio source, the sound travels through the environment and may undergo reflection, diffraction, scattering, and transmission effects before the sound is heard by a listener.

The most accurate interactive techniques for sound propagation and rendering are based on a convolution-based sound rendering pipeline that segments the computation into three main components. The first component, the sound propagation module, uses geometric algorithms like ray or beam tracing to simulate how sound travels through the environment and computes an impulse response (IR) between each source and listener. The second component converts the IR into a spatial impulse response (SIR) that is suitable for auralization of directional sound. Finally, the auralization module convolves each channel of the SIR with the anechoic audio for the sound source to generate the audio which is reproduced to the listener through an auditory display device (e.g., headphones).

Algorithms that use a convolution-based pipeline can generate high-quality interactive audio for scenes with dozens of sound sources on commodity high power computing machines (e.g., desktop and laptop computers/machines). However, these methods are less suitable for low-power mobile devices where there are significant computational and memory constraints. For example, the IR contains directional and frequency-dependent data that requires up to 10-15 MB per sound source, depending on the number of frequency bands, length of the impulse response, and the directional representation. This large memory usage severely constrains the number of sources that can be simulated concurrently. In addition, the number of rays that must be traced during sound propagation to avoid an aliased or noisy IR can be large and take 100 ms to compute on a multi-core CPU for complex scenes. The construction of the SIR from the IR is also an expensive operation that takes about 20-30 ms per source for a single CPU thread. Convolution with the SIR requires time proportional to the length of the impulse response, and the number of concurrent convolutions is limited by the tight real-time deadlines needed for smooth audio rendering without clicks or pops.

A low-cost alternative to convolution-based sound rendering is to use artificial reverberators. Notably, artificial reverberation algorithms use recursive feedback-delay networks to simulate the decay of sound in rooms/scenes. These filters are typically specified using different parameters like the reverberation time, direct-to-reverberant (D/R) sound ratio, predelay, reflection density, directional loudness, and the like. These parameters are either specified by an artist or approximated using scene characteristics. However, most prior approaches for rendering artificial reverberation assume that the reverberant sound field is completely diffuse. As a result, this approach cannot be used to efficiently generate accurate directional reverberation or time-varying effects in dynamic scenes. Compared to convolution-based rendering, previous artificial reverberation methods suffer from reduced quality of spatial sound and can have difficulties in automatic determination of dynamic reverberation parameters.

The disclosed subject matter presents a new approach for sound rendering that combines ray-tracing-based sound propagation with reverberation filters to generate smooth, plausible audio for dynamic scenes with moving sources and objects. Notably, the disclosed sound rendering pipeline system dynamically computes reverberation parameters using an interactive ray tracing algorithm that computes an IR with a low sample rate (e.g., 100 Hz). Notably, the IR is derived using only a few tens or hundreds of sound propagation rays (e.g., a predefined number of frequency bands that are sampled at a predefined coarse/less frequent sample rate). In some embodiments, the number of chosen sound propagation rays can be selected or defined by a system user. The greater the number of rays selected, the more accurate and/or realistic the audio output. Notably, the number of selected rays that can be processed depends largely on the computing capabilities and resources of the host device. For example, fewer sound propagation rays are selected on a low powered device (e.g., a smartphone device). In contrast, a higher number of rays may be selected when a high power device (e.g., a desktop or laptop computing device) is utilized. Regardless of the type of device chosen, the number of sound propagation rays utilized by the disclosed pipeline system is much lower than what is used in prior ray-tracing methods and techniques.

Moreover, direct sound, early reflections, and late reverberation are rendered using spherical harmonic basis functions, which allow the sound rendering pipeline system to capture many important features of the impulse response, including the directional effects. Notably, the number of convolution operations performed in the sound rendering pipeline is constant (e.g., due to the predefined number of frequency bands, i.e., coarsely sampled rays), as this computation is performed only for the listener and does not scale with the number of sources. Moreover, the disclosed sound rendering pipeline system is configured to perform convolutions with very short impulse responses for spatial sound. This approach has been both quantitatively and subjectively evaluated on various interactive scenes with 7-23 sources and observe significant improvements of 9-15 times compared to convolution-based sound rendering approaches. Furthermore, the disclosed sound rendering pipeline reduces the memory overhead by about 10 times (10×). Notably, this approach is capable of rendering high-quality interactive sound propagation on a mobile device with both low memory and computational overhead.

Various methods for computing sound propagation and impulse responses in virtual environments can be divided into two broad categories: wave-based sound propagation and geometric sound propagation. Wave-based sound propagation techniques directly solve the acoustic wave equation in either time domain or frequency domain using numerical methods. These techniques are the most accurate methods, but scale poorly with the size of the domain and the maximum frequency. Current precomputation-based wave propagation methods are limited to static scenes. Geometric sound propagation techniques make the simplifying assumption that surface primitives are much larger than the wavelength of sound. As a result, the geometric sound propagation techniques are better suited for interactive applications, but do not inherently simulate low-frequency diffraction effects. Some techniques based on the uniform theory of diffraction have been used to approximate diffraction effects for interactive applications. Specular reflections are frequently computed using the image source method (ISM), which can be accelerated using ray tracing or beam tracing. The most common techniques for diffuse reflections are based on Monte Carlo path or sound particle tracing. Ray tracing may be performed from either the source, listener, or from both directions and can be improved by utilizing temporal coherence. Notably, the disclosed sound rendering pipeline system can be combined with any ray-tracing based interactive sound propagation algorithm.

In convolution-based sound rendering, an impulse response (IR) is convolved with the dry source audio. The fastest convolution techniques are based on convolution in the frequency domain. To achieve low latency, the IR is partitioned into blocks with smaller partitions toward the start of the IR. Time-varying IRs can be handled by rendering two convolution streams simultaneously and interpolating between their outputs in the time domain. Artificial reverberation methods approximate the reverberant decay of sound energy in rooms using recursive filters and feedback delay networks. Artificial reverberation has also been extended to B-format ambisonics.

In spatial sound rendering, the goal is to reproduce directional audio that gives the listener a sense that the sound is localized in 3D space (e.g., virtual environment/scene). This involves modeling the impacts of the listener's head and torso on the audio sound received at each ear. The most computationally efficient methods are based on vector-based amplitude panning (VBAP), which compute the amplitude for each channel based on the direction of the sound source relative to the nearest speakers and are suited for reproduction on surround-sound systems. Head-related transfer functions (HRTFs) are also used to model spatial sound that can incorporate all spatial sound phenomena using measured IRs on a spherical grid surrounding the listener.

The disclosed sound rendering pipeline system uses spherical harmonic (SH) basis functions. SH are a set of orthonormal basis functions $Y_{lm}(\vec{x})$ defined on the spherical domain $\mathbb{S}$, where $\vec{x}$ is a vector of unit length, l=0, 1 . . . n and m=−l, . . . 0, . . . l and n is the spherical harmonic order. For SH order n, there are $(n+1)^2$ basis functions. Due to their orthonormality, SH basis function coefficients can be efficiently rotated using a $(n+1)^2$ by $(n+1)^2$ block-diagonal matrix. While the SH are defined in terms of spherical coordinates, they can be evaluated for Cartesian vector arguments using a fast formulation that uses constant propagation and branchless code to speed up the function evaluation. SHs have been used as a representation of spherical data, such as the HRTF, and also form the basis for the ambisonic spatial audio technique.

Notably, the disclosed sound rendering pipeline system constitutes a new integrated approach for sound rendering that performs propagation and spatial sound auralization using ray-parameterized reverberation filters. Notably, the sound rendering pipeline system is configured to generate high-quality spatial sound for direct sound, early reflections, and directional late reverberation with significantly less computational overhead than convolution-based techniques. The sound rendering pipeline system renders audio in the SH domain and facilitates spatialization with either the user's head-related transfer function (HRTF) or amplitude panning. An overview of this sound rendering pipeline system is shown in FIG. 2.

Figure 2:
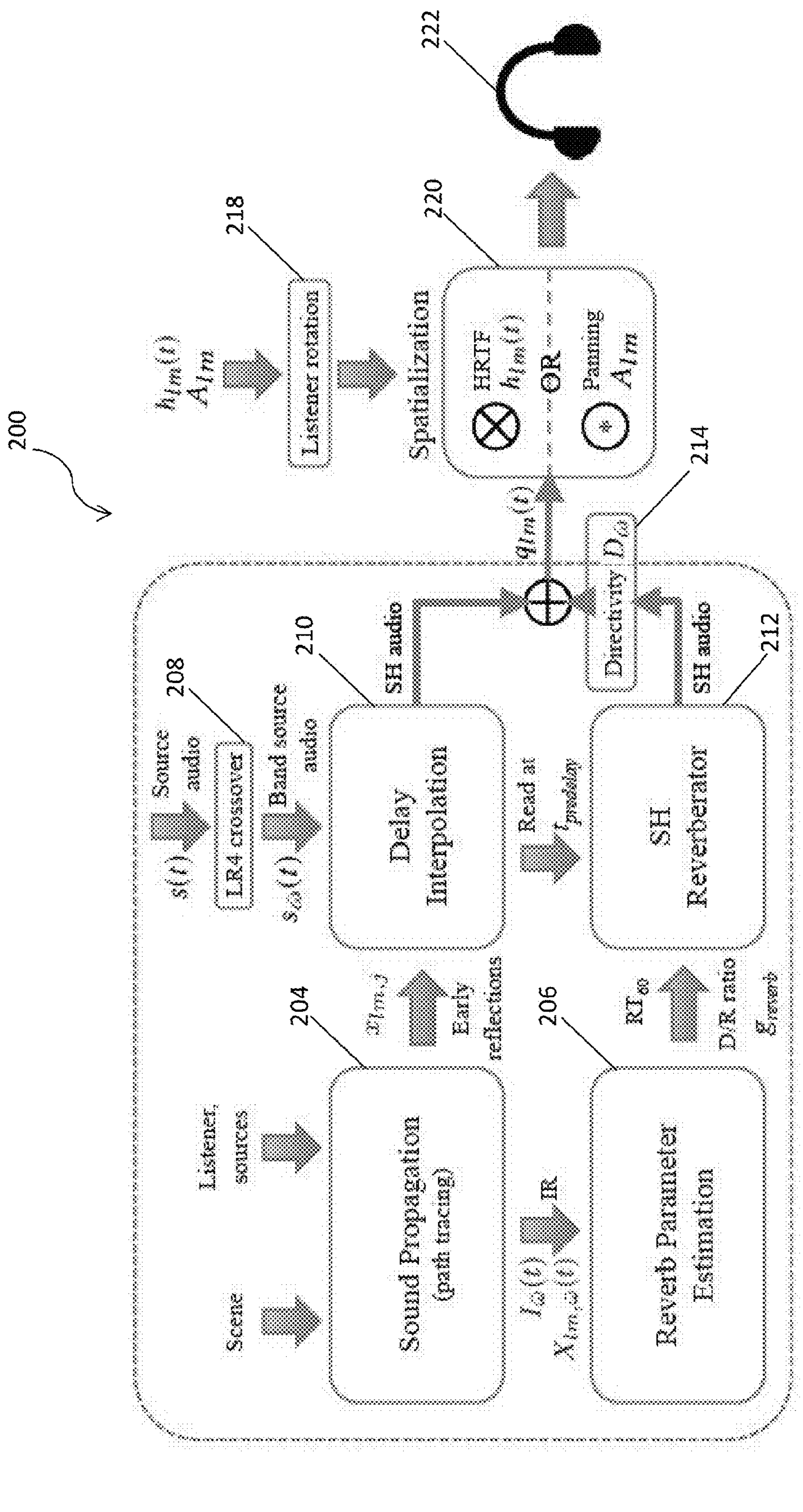
FIG. 2 is a block diagram illustrating a logical representation of a sound rendering pipeline according to an embodiment of the subject matter described herein.

FIG. 2 is a block diagram illustrating a logical representation of a sound rendering pipeline according to an embodiment of the subject matter described herein. In FIG. 2, a sound propagation engine 204 uses ray and path tracing to estimate the directional and frequency-dependent IR at a low sampling rate (e.g. 100 Hz). Using this IR as input, a reverberation parameter estimator 206 is configured to robustly estimate a plurality of reverberation parameters, such as the reverberation time ($RT_{60}$) and direct-to-reverberant (D/R) sound ratio for each frequency band. This generated parameter information is then used to parameterize the filters in an artificial reverberator 212, such as an SH reverberator. Due to the robustness of a parameter estimation and auralization algorithm, the disclosed sound rendering pipeline system 200 is able to use an order of magnitude fewer rays than convolution-based rendering in the sound propagation engine 204. Artificial reverberator 212 renders a separate channel for each frequency band and SH coefficient, and uses spherical harmonic rotations in a comb-filter feedback path to mix the SH coefficients and produce a natural distribution of directivity for the reverberation decay. At the reverberation output, a directivity manager 214 applies a frequency-dependent directional loudness to the reverberation signal in order to model the overall frequency-dependent directivity and then sums the audio into a broadband signal in the SH domain. For the direct sound and early reflection, monaural samples are interpolated from a circular delay buffer of dry source audio and are multiplied by the reflection's SH coefficients. The resulting audio for the early reflections are mixed with the late reverberation in the SH domain. This audio is computed for every sound source and then mixed together by audio mixing engine 216. Then in a final spatialization step, the audio for all sources is convolved by spatialization engine 220 with a rotated version of the user's HRTF in the SH domain. The resulting audio q(t) is spatialized direct sound, early reflections, and late reverberation with the directivity information.

The disclosed sound rendering pipeline system 200 is configured to render artificial reverberation that closely matches the audio generated by convolution-based techniques. The sound rendering pipeline system 200 is further configured to replicate the directional frequency-dependent time-varying structure of a typical IR, including direct sound, early reflections (ER), and late reverberation (LR).

Sound Rendering:

To render spatial reverberation, an artificial reverberator 212 (e.g., an SH reverberator) is configured to utilize $N_{comb}$ comb filters in parallel, followed by $N_{ap}$ all-pass filters in series. In some embodiments, artificial reverberator 212 produces frequency-dependent reverberation by filtering the anechoic input audio, s(t), into $N\overline{\omega}$ discrete frequency bands using an all-pass Linkwitz-Riley 4th-order crossover to yield a stream of audio for each frequency band, $s_{\overline{\omega}}(t)$. Artificial reverberator 212 uses different feedback gain coefficients for each band in order to replicate the spectral content of the sound propagation IR and to produce different $RT_{60}$ times at different frequencies. To render directional reverberation, artificial reverberator 212 is extended to operate in the spherical harmonic domain, rather than the scalar domain. Artificial reverberator 212 now renders $N\overline{\omega}$ frequency bands for each SH coefficient. Therefore, the reverberation for each sound source includes $(n+1)^2N\overline{\omega}$ channels, where n is the spherical harmonic order.

Input Spatialization:

To model the directivity of the early reverberant impulse response, spatialization engine 220 spatializes the input audio for each comb filter according to the directivity of the early IR. The spherical harmonic distribution of sound energy arriving at the listener for the ith comb filter is denoted as $X_{lm,i}$. This distribution can be computed by the spatialization engine 220 from the first few non-zero samples of the IR directivity, $X_{lm}(t)$, by interpolating the directivity at offset $t_{comb}^{\,i}$ past the first non-zero IR sample for each comb filter. Given $X_{lm,i}$, spatialization engine 220 extracts the dominant Cartesian direction from the distribution's 1st-order coefficients: $\vec{x}_{max,i}$=normalize($-X_{1,1,i}$ — $X_{1,-1,i}X_{1,0,i}$). The input audio in the SH domain for the ith comb filter is then given by evaluating the real SHs in the dominant direction and multiplying by the band-filtered source audio:

$$S_{\overline{\omega},lm}(t)=\frac{1}{N_{comb}}Y_{lm}(\vec{x}_{max,i})s_{\overline{\omega}}(t).$$

Spatialization engine 220 applies a normalization factor $$\frac{1}{N_{comb}}$$

so that the reverberation loudness is independent of the number of comb filters.

SH Rotations:

To simulate how sound tends to increasingly diffuse towards the end of the IR, artificial reverberator 212 uses SH rotation matrices in the comb filter feedback paths to scatter the sound. The initial comb filter input audio is spatialized with the directivity of the early IR, and then the rotations progressively scatter the sound around the listener as the audio makes additional feedback loops through the filter. At the initialization time, artificial reverberator 212 generates a random rotation about the x, y, and z axes for each comb filter and represent this rotation by 3×3 rotation matrix ($R_i$) for the ith comb filter. The matrix is chosen by the artificial reverberator 212 such that the rotation is in the range [90°, 270° ] in order to ensure there is sufficient diffusion. Next, artificial reverberator 212 builds a SH rotation matrix, $J(R_i)$, from $R_i$ that rotates the SH coefficients of the reverberation audio samples during each pass through the comb filter. In some embodiments, artificial reverberator 212 can combine the rotation matrix with the frequency-dependent comb filter feedback gain $g_{comb,\overline{\omega}}^{\,i}$ to reduce the total number of operations required. Therefore, during each pass through each comb filter, the delay buffer sample (e.g., a vector of $(n+1)^2N\overline{\omega}$ values) is multiplied by matrix $J(R_i)g_{comb,\overline{\omega}}^{\,i}$. For the case of SH order n=1, this operation is essentially a 4×4 matrix-vector multiply for each frequency band. It may also be possible to use SH reflections instead of rotations to implement this diffusion process.

Directional Loudness:

While the comb filter input spatializations model the initial directivity of the IR, and SH rotations can be used to model the increasing diffuse components in the later parts of the IR, directivity manager 214 may be configured to model the overall directivity of the reverberation. The weighted average directivity in SH domain for each frequency band, $\overline{X}_{\overline{\omega},lm}$ can be easily computed from the IR by weighting the directivity at each IR sample by the intensity of that sample:

$$\overline{X}_{\overline{\omega},lm}=\frac{1}{\int_0^\infty I_{\overline{\omega}}(t)\,dt}\int_0^\infty X_{\overline{\omega},lm}(t)I_{\overline{\omega}}(t)\,dt$$

Given $\overline{X}_{\overline{\omega},lm}$, directivity manager 214 is configured to determine a transformation matrix $D_{\overline{\omega}}$ of size $(n+1)^2\times(n+1)^2$ that is applied to the $(n+1)^2$ reverberation output SH coefficients produced by reverberator 212 in order to produce a similar directional distribution of sound for each frequency band $\overline{\omega}$. This transformation can be computed efficiently by directivity manager 214, which uses a technique for ambisonics directional loudness. The spherical distribution of sound $\overline{X}_{\overline{\omega},lm}$ is sampled for various directions in a spherical t-design by directivity manager 214, and then the discrete SH transform is applied directivity manager 214 to compute matrix $D_{\overline{\omega}}$. $D_{\overline{\omega}}$ can then be applied by directivity manager 214 to the SH coefficients of band $\overline{\omega}$ of each output audio sample after the last all-pass filter of reverberator 212.

Early Reflections:

The early reflections and direct sound are rendered in frequency bands using a separate delay interpolation module, such as delay interpolation engine 210. Each propagation path rendered in this manner produces $(n+1)^2 N_{\overline{\omega}}$, output channels that correspond to the SH basis function coefficients at $N_{\overline{\omega}}$ different frequency bands. The amplitude for each channel is weighted by delay interpolation engine 210 according to the SH directivity for the path, where $X_{lm,j}$ are the SH coefficients for path j, as well as the path's pressure for each frequency band. This enables sound rendering pipeline system 200 to handle area sound sources and diffuse reflections that are not localized in a single direction, as well as Doppler shifting for direct sound and early reflections.

Spatialization:

After the audio for all sound sources has been rendered in the SH domain and mixed together by audio mixing engine 216, the mixed audio needs to be spatialized for the final output audio format to be delivered to listener 222. The audio for all sources in the SH domain is represented by $q_{lm}(t)$. After spatialization is performed by spatialization engine 220, the resulting audio for each output channel is q(t). In some embodiments, spatialization may be executed by spatialization engine 220 by one of two techniques: the first using convolution with the listener's HRTF for binaural reproduction, and a second using amplitude panning for surround-sound reproduction systems.

In some embodiments, spatialization engine 220 spatializes the audio using HRTF by convolving the audio with the listener's HRTF. The HRTF, $H(\vec{x}, t)$, is projected into the SH domain in a preprocessing step to produce SH coefficients $h_{lm}(t)$. Since all audio is rendered in the world coordinate space, spatialization engine 220 applies the listener's head orientation to the HRTF coefficients before convolution to render the correct spatial audio. If the current orientation of the listener's head is described by 3×3 rotation matrix $R_L$, spatialization engine 220 may construct a corresponding SH rotation matrix $\mathcal{J}(R_L)$ that rotates HRTF coefficients from the listener's local orientation to world orientation. In some embodiments, spatialization engine 220 may then multiply the local HRTF coefficients by $\mathcal{J}$ to generate the world-space HRTF coefficients: $h_{lm}^{L}(t)=\mathcal{J}(R_L)h_{lm}(t)$. This operation is performed once for each simulation update. The world-space reverberation, direct sound, and early reflection audio for all sources is then convolved with the rotated HRTF by spatialization engine 220. If the audio is rendered up to SH order n, the final convolution will consist of $(n+1)^2$ channels for each ear corresponding to the basis function coefficients. After the convolution operation is conducted by spatialization engine 220, the $(n+1)^2$ channels for each ear are summed to generate the final spatialized audio, q(t). This operation is summarized in the following equation:

$$q(t) = \sum_{l=0}^{n} \sum_{m=-l}^{l} q_{lm}(t) \otimes [\mathcal{J}(\mathcal{R}_L) h_{lm}(t)]$$

In some embodiments, spatialization engine 220 may be configured to efficiently spatialize the final audio using amplitude panning for surround-sound applications. In such a case, no convolution operation is required and sound rendering pipeline system 200 is even more efficient. Starting with any amplitude panning model, e.g. vector-based amplitude panning (VBAP), spatialization engine 220 first converts the panning amplitude distribution for each speaker channel into the SH domain in a preprocessing step. If the amplitude for a given speaker channel as a function of direction is represented by $A(\vec{x})$ spatialization engine 220 computes SH basis function coefficients $A_{lm}$ by evaluating the SH transform. Like the HRTF, these coefficients must be rotated at runtime from listener-local to world orientation using matrix $\mathcal{J}(R_L)$ each time the orientation is updated. Then, rather than performing a convolution, spatialization engine 220 computes the dot product of the audio SH coefficients $q_{lm}(t)$ with the panning SH coefficients $A_{lm}$ for each audio sample:

$$q(t) = \sum_{l=0}^{n} \sum_{m=-l}^{l} q_{lm}(t)[\mathcal{J}(\mathcal{R}_L) A_{lm}]$$

With just a few multiply-add operations per sample, spatialization engine 220 can efficiently spatialize the audio for all sound sources using this method.

Reverberation Parameter Estimation:

In some embodiments, the disclosed sound rendering pipeline system 200 is configured to derive reverberation parameters that are needed to effectively render accurate reverberation. The reverberation parameters are computed using interactive ray tracing. The input to reverberation parameter estimator 206 is a sound propagation IR generated by sound propagation engine 204 that contains only the higher-order reflections (e.g., no early reflections or direct sound). In some embodiments, the sound propagation IR includes a histogram of sound intensity over time for various frequency bands, $I_{\overline{\omega}}(t)$, along with SH coefficients describing the spatial distribution of sound energy arriving at the listener position at each time sample, $X_{\overline{\omega},lm}(t)$. In some embodiments, the IR is computed by sound propagation engine 204 at a low sample rate (e.g. 100 Hz) to reduce the noise in the Monte Carlo estimation of path tracing and to reduce memory requirements, since it is not necessary to use it for convolution at typical audio sampling rates (e.g. 44.1 kHz). This low sample rate utilized by sound propagation engine 204 is sufficient to capture the meso-scale structure of the IRs.

Reverberation Time:

The reverberation time, denoted as $RT_{60}$, captures much of the sonic signature of an environment and corresponds to the time it takes for the sound intensity to decay by 60 dB from its initial amplitude. In some embodiments, reverberation parameter estimator 206 estimates the $RT_{60}$ from the intensity IR $I_{\overline{\omega}}(t)$. This operation is performed independently by reverberation parameter estimator 206 for each simulation frequency band to yield $RT_{60,\overline{\omega}}$. Since the IR may contain significant amounts of noise, the $RT_{60}$ estimate may discontinuously change on each simulation update because the decay rate is sensitive to small perturbations. To reduce the impact of this effect, reverberation parameter estimator 206 may use temporal coherence to smooth the $RT_{60}$ over time with exponential smoothing. Given a smoothing time constant, reverberation parameter estimator 206 may compute an exponential smoothing factor $\alpha\in[0,1]$, then use $\alpha$ to filter the $RT_{60}$ estimate:

$$RT_{60,\overline{\omega}}{}^{n} = \mathbb{RT}_{60,\overline{\omega}}{}^{n} = \alpha \tilde{RT}_{60,\overline{\omega}}{}^{n} + (1-\alpha)\mathbb{RT}_{60,\overline{\omega}}{}^{n-1},$$

where $RT_{60,\overline{\omega}}{}^{n}$ is the smoothed $RT_{60}$, $\tilde{RT}_{60,\overline{\omega}}{}^{n}$ is the $RT_{60}$ estimated from the current frame's IR, $\mathbb{RT}_{60,\overline{\omega}}{}^{n-1}$ is the cached $RT_{60}$ value, and $\mathbb{RT}_{60,\overline{\omega}}{}^{n}$ is the cached value for the next frame. By applying this smoothing, reverberation parameter estimator 206 reduces the variation in the $RT_{60}$ over time. This also implies that the $RT_{60}$ may take about $\tau$ seconds to respond to an abrupt change in a scene (e.g., virtual environment). However, since $RT_{60}$ is a global property of the environment and usually changes slowly, the perceptual impact of smoothing is less than that caused by noise in the $RT_{60}$ estimation. Smoothing the $RT_{60}$ also makes the estimation more robust to noise in the IR caused by tracing only a few primary rays during sound propagation.

Direct to Reverberant Ratio:

In some embodiments, the direct to reverberant ratio (D/R ratio) estimated by reverberation parameter estimator 206 determines how loud the reverberation should be in comparison to the direct sound. The D/R ratio is important for producing accurate perception of the distance to sound sources in virtual environments. The D/R ratio is described by the gain factor $g_{reverb}$ that is applied to the reverberation output produced by reverberation parameter estimator 206, such that the reverberation mixed with ER and direct sound closely matches the original sound propagation impulse response.

To robustly estimate the reverberation loudness from a noisy IR, a method that has very little susceptibility to noise must be selected. In some embodiments, the most consistent metric was found to be the total intensity contained in the IR, i.e., $$I_{\varpi}^{total} = \int_0^\infty I_{\varpi}(t)\,dt.$$

To compute the correct reverberation gain, reverberation parameter estimator 206 derive a relationship between $I_{\varpi}^{total}$ and $g_{reverb}$. This can be performed by determining the total intensity in the IR of reverberator 212 with $g_{reverb}=1$, $I_{reverb}^{total}$. Then, the gain factor of the reverberation output for each frequency band can be computed by as the ratio of $I_{\varpi}^{total}$ to $I_{reverb,\varpi}^{total}$:

$$g_{reverb,\varpi} = \sqrt{\frac{I_{\varpi}^{total}}{I_{reverb,\varpi}^{total}}}.$$

The square root converts the ratio from intensity to the pressure domain. To compute $I_{reverb,\varpi}^{total}$, given the $RT_{60}$, reverberation parameter estimator 206 models the reverberator's pressure envelope using a decaying exponential function $P_{reverb,\varpi}(t)$, derived from the definition of a comb filter:

$$p_{reverb,\varpi}(t) = \begin{cases} 0: & t < 0, \\ (g_{r,\varpi})^t: & t \geq 0, \end{cases}$$

where $g_{r,\varpi}$ is the feedback gain for a comb filter with $t_{comb}=1$ computed via the following equation:

$$g_{comb}^{i} = 10^{-3 t_{comb}^{i}/RT_{60}}.$$

In some embodiments, reverberation parameter estimator 206 computes the total intensity of the reverberator 212 by converting $P_{reverb}(t)$ to intensity domain by squaring, and then integrating from 0 to $\infty$:

$$I_{reverb,\varpi}^{total} = \int_0^\infty (p_{reverb}(t))^2\,dt = \frac{-1}{\ln(g_{r,\varpi}^2)} = \frac{RT_{60,\varpi}}{6\ln 10}.$$

After $I_{reverb,\varpi}^{total}$ is computed, the gain factor for reverberator 212 can be computed using the above equation for $g_{reverb,\varpi}$. Determining the reverberation loudness in this manner is very robust to noise because reverberator 212 reuses as many Monte Carlo samples as possible from ray tracing.

Reverberation Predelay:

In some embodiments, a delay interpolation engine 210 is configured to produce a reverberation predelay. As used herein, the reverberation predelay is the time in seconds that the first indirect sound arrival is delayed from t=0. In some embodiments, the predelay is correlated to the size of the environment. The predelay can be computed from the IR via delay interpolation engine 210 finding the time delay of the first non-zero sample, e.g., find $t_{predelay}$ such that $I_{\varpi}(t_{predelay}) \neq 0$ and $I_{\varpi}(t<t_{predelay})=0$ for all frequency bands. This delay time is used as a parameter for delay interpolation engine 210 of sound rendering pipeline 200. The input audio for the reverberator is read from the sound source's circular delay buffer at the time offset corresponding to the predelay. This allows sound rendering pipeline system 200 to replicate the initial reverberation delay and give a plausible impression of the size of the virtual environment.

Reflection Density:

In order to produce reverberation that closely corresponds to the environment, the reflection density is also modeled by sound rendering pipeline system 200. As used herein, reflection density is a parameter that is influenced by the size of the scene and controls whether the reverberation is perceived as smooth decay or distinct echoes. Reverberation parameter estimator 206 performs this by gathering statistics about the rays traced during sound propagation, namely the mean free path of the environment. The mean free path, $\bar{r}_{free}$, is the average unoccluded distance between two points in the environment and can be estimated by sound propagation engine 204 during path tracing by computing the average distance that all rays travel. Given $\bar{r}_{free}$, reverberation parameter estimator 206 can then choose reverberation parameters that produce echoes every $\bar{r}_{free}/c$ seconds, where c is the speed of sound. To perform, reverberation parameter estimator 206 may sample comb filter feedback delay times, $t_{comb}$, from a Gaussian distribution centered at $\bar{r}_{free}/c$ with standard deviation $\sigma=\frac{1}{3}\bar{r}_{free}/c$. The feedback delay times are computed at the first initialization and updated only when $\bar{r}_{free}/c$ deviates from the previous value by more than $2\sigma$ in order to reduce artifacts caused by resizing the delay buffers.

Example Implementation

In Some Embodiments, the Sound propagation engine 204 of the disclosed sound rendering pipeline computes sound propagation in four logarithmically spaced frequency bands: 0-176 Hz, 176-775 Hz, 775-3408 Hz, and 3408-22050 Hz. To compute the direct sound, sound propagation engine 204 may use a Monte Carlo integration approach to find the spherical harmonic projection of sound energy arriving at the listener. The resulting SH coefficients can be used to spatialize the direct sound for area sound sources using the disclosed rendering approach. To compute early reflections and late reverberation, backward path tracing is used from the listener because it scales well with the number of sources. Forward or bidirectional ray tracing may also be used. In some embodiments, the path tracing is augmented using diffuse rain, a form of next-event estimation, in order to improve the path tracing convergence. To handle early reflections, the first 2 orders of reflections are used in combination with the diffuse path cache temporal coherence approach to improve the quality of the early reflections when a small number of rays are traced. The disclosed sound rendering pipeline system 200 improves on the original cache implementation by augmenting it with spherical-harmonic directivity information for each path. For reflections over order 2, sound propagation engine 204 accumulates the ray contributions to an impulse response cache that utilizes temporal coherence in the late IR. The computed IR has a low sampling rate of 100 Hz that is sufficient to capture the meso-scale IR structure. Reverberation parameter estimator 206 use this IR to estimate reverberation parameters. Due to the low IR sampling rate, sound propagation engine 204 can trace far fewer rays to maintain good sound quality. In some embodiments, sound propagation engine 204 emit 50 primary rays from the listener on each frame and propagate those rays to reflection order of 200. If a ray escapes the scene before it reflects 200 times, the unused ray budget is used to trace additional primary rays. Therefore, the sound rendering pipeline system 200 may emit more than 50 primary rays on outdoor scenes, but always traces the same number of ray path segments. The two temporal coherence data structures (for ER and LR) use different smoothing time constants $\tau_{ER}$=1s and $\tau_{LR}$=3s, in order to reduce the perceptual impact of lag during dynamic scene changes. The disclosed system does not currently handle diffraction effects, but it could be configured to augment the path tracing module with a probabilistic diffraction approach, though with some extra computational cost. Other diffraction algorithms such as UTD and BTM require significantly more computation and would not be as suitable for low-cost sound propagation. Sound propagation can be computed using 4 threads on a 4-core computing machine, or using 2 threads on a Google Pixel XL™ mobile device.

Further, auralization is performed using the same frequency bands that are used for sound propagation. The disclosed system may make extensive use of SIMD vector instructions to implement rendering in frequency bands efficiently: bands are interleaved and processed together in parallel. The audio for each sound source is filtered into those bands using a time-domain Linkwitz-Riley 4th-order crossover and written to a circular delay buffer. The circular delay buffer is used as the source of prefiltered audio for direct sound, early reflections, and reverberation. The direct sound and early reflections read delay taps from the buffer at delayed offsets relative to the current write position. The reverberator reads its input audio as a separate tap with delay $t_{predelay}$. The reverberator further uses $N_{comb}$=8 comb filters and $N_{ap}$=4 all-pass filters. This improves the subjective quality of the reverberation as compared to other solutions or designs.

The disclosed subject matter uses a different spherical harmonic order for the different sound propagation components. For direct sound, SH order n=3 is used because the direct sound is highly directional and perceptually important. For early reflections, SH order n=2 is used because the ER are slightly more diffuse than direct sound and so a lower SH order is not noticeable. For reverberation, SH order n=1 is used because the reverberation is even more diffuse and less important for localization. When the audio for all components is summed together, the unused higher-order SH coefficients are assumed to be zero. This configuration provided the best trade-off between auralization performance and subjective sound quality by using higher-order spherical harmonics only where needed.

To avoid rendering too many early reflection paths, a sorting and prioritization step is applied to the raw list of the paths. First, any paths that have intensity below the listener's threshold of hearing is discarded. Then, the paths are sorted in decreasing intensity order and use only the first $N_{ER}$=100 among all sources for audio rendering. The unused paths are added to the late reverberation IR before it is analyzed for reverberation parameters. This limits the overhead for rendering early reflections by rendering only the most important paths. Auralization is implemented on a separate thread from the sound propagation and therefore is computed in parallel. The auralization state is synchronously updated each time a new sound propagation IR is computed.

Results and Analysis:

The disclose subject matter was evaluated on a computing machine using five benchmark scenes that are summarized in FIG. 3. Notably, FIG. 3 illustrates a table containing the main results of the sound propagation and auralization approach implemented by the disclosed sound rendering pipeline system. In the upper part of the table 300, performance results are shown using four ray tracing threads and one auralization thread on a high power desktop machine (e.g., i7 4770k CPU). In the lower part of table 300, results for benchmarks on a low power device (e.g., Google Pixel XL mobile device) with two tracing threads and one auralization thread. Notably, the disclosed subject matter is able to achieve significant speed up of about 10× over convolution-based rendering on high power desktop CPUs, and is the first to demonstrate interactive dynamics sound propagation on a low-power mobile CPU device. The scenes indicated in table 300 contain between 12 and 23 sound sources and have up to 1 million triangles as well as dynamic rigid objects. For two of the five scenes, versions with less sound sources that were suitable for running on a mobile device were also prepared. In table 300, the main results of the disclosed technique is depicted, including the time taken for ray tracing, analysis of the IR (determination of reverberation parameters), as well as auralization. The auralization time is reported as the percentage of real time needed to render an equivalent length of audio, where 100% indicates the rendering thread is fully saturated. The results for the five large scenes were measured on a 4-core Intel i7 4770k CPU, while the results for the mobile scenes were measured on a Google Pixel XL™ phone with a 2+2 core Snapdragon 821 chipset.

The sound propagation performance is reported in table 300. On the desktop machine, roughly 6-14 ms is spent on ray tracing in the five main scenes. This corresponds to about 0.5-0.75 ms per sound source. The ray tracing performance scales linearly with the number of sound sources and is typically a logarithmic function of the geometric complexity of the scene. On the mobile device, ray tracing is substantially slower, requiring about 10 ms for each sound source. This may be because the ray tracer is more optimized for Intel CPUs than ARM CPUs. The time taken to analyze the impulse response and determine reverberation parameters is also reported. On both the desktop and mobile device, this component takes about 0.1-0.5 ms. The total time to update the sound rendering system is 7-14 ms on the desktop and 66-84 ms on the mobile device. As a result, the latency of the disclosed approach is low enough for interactive applications and is the first to enable dynamic sound propagation on a low-power mobile device.

Figure 4:
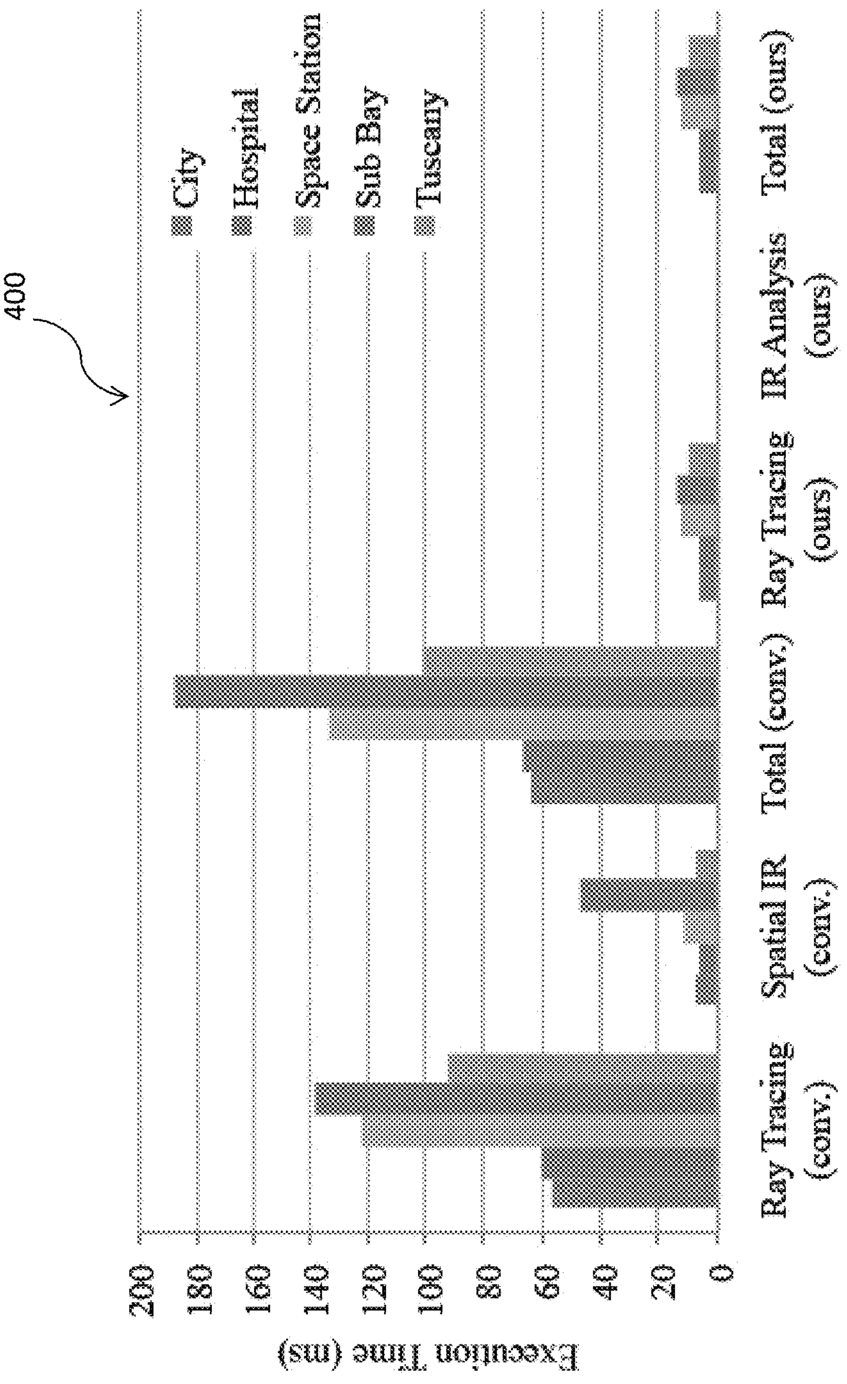
FIG. 4 is a graph illustrating a comparison between the sound propagation performance of an exemplary sound rendering pipeline executed on a low-powered device and a traditional convolution based architecture on a desktop machine according to an embodiment of the subject matter described herein.

In comparison, the performance of traditional convolution-based rendering is substantially slower. Graph 400 of FIG. 4 shows a comparison between the sound propagation performance of state of the art convolution-based rendering and the approach facilitated by the disclosed subject matter. Convolution-based rendering requires about 500 rays to achieve sufficient sound quality without unnatural sampling noise when temporal coherence is used. In contrast, the disclosed approach is able to use only 50 rays due to its robust reverberation parameter estimation and rendering algorithm. This provides a substantial speedup of 9.2-12.8× on the desktop machine, and a 12.1-15.5 speedup on the mobile device. A significant bottleneck for convolution-based rendering is the computation of spatial impulse responses from the ray tracing output, which requires time proportional to the IR length. The Sub Bay scene has the longest impulse response and has a spatial IR cost of 48 ms that is several times that of the other scenes. However, the approach requires less than a millisecond to analyze the IR and update the reverberation parameters.

Figure 5:
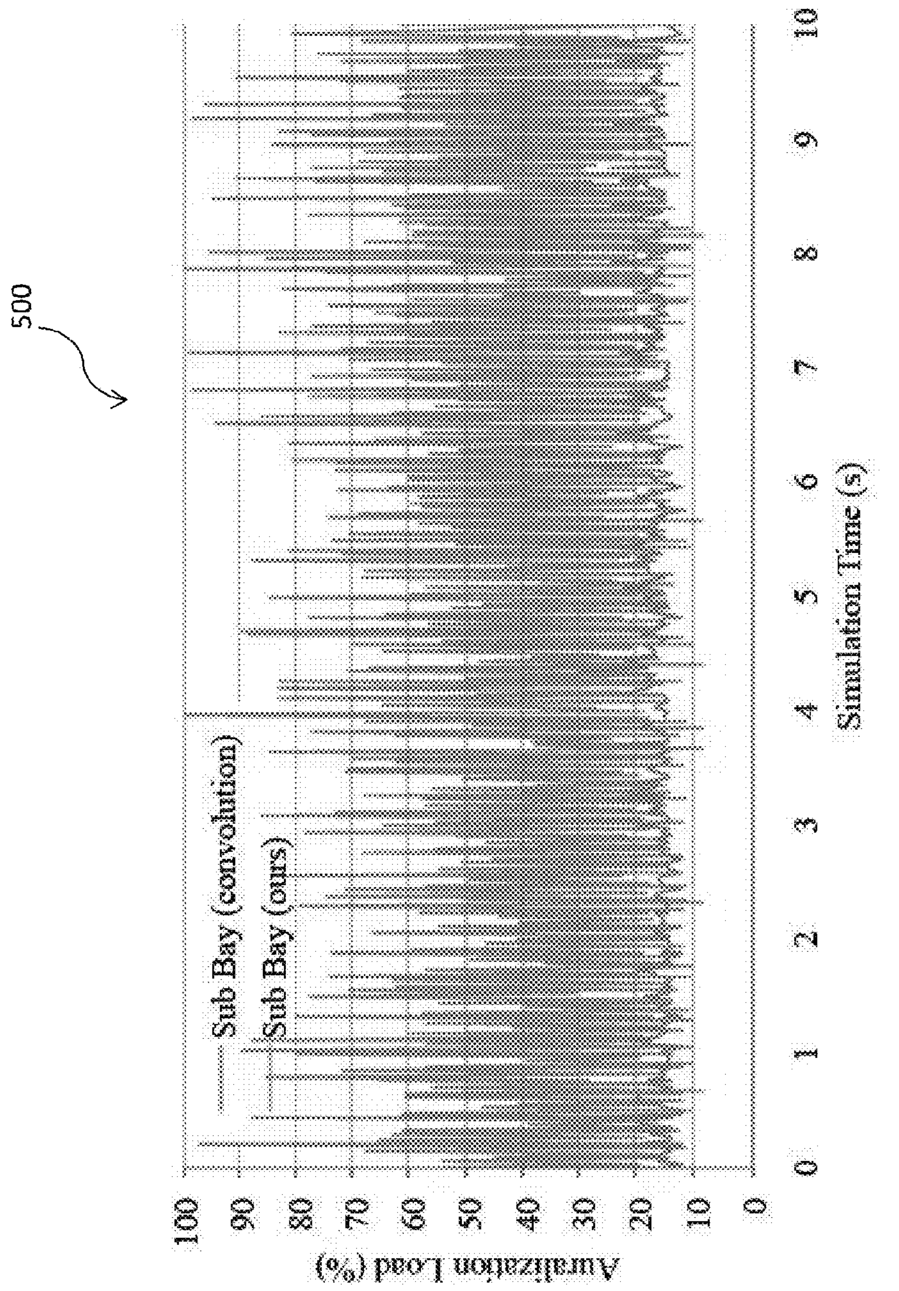
FIG. 5 is a graph illustrating a performance comparison between the disclosed reverberation rendering algorithm and a traditional convolution-based rendering architecture on a single thread according to an embodiment of the subject matter described herein.
Figure 6:
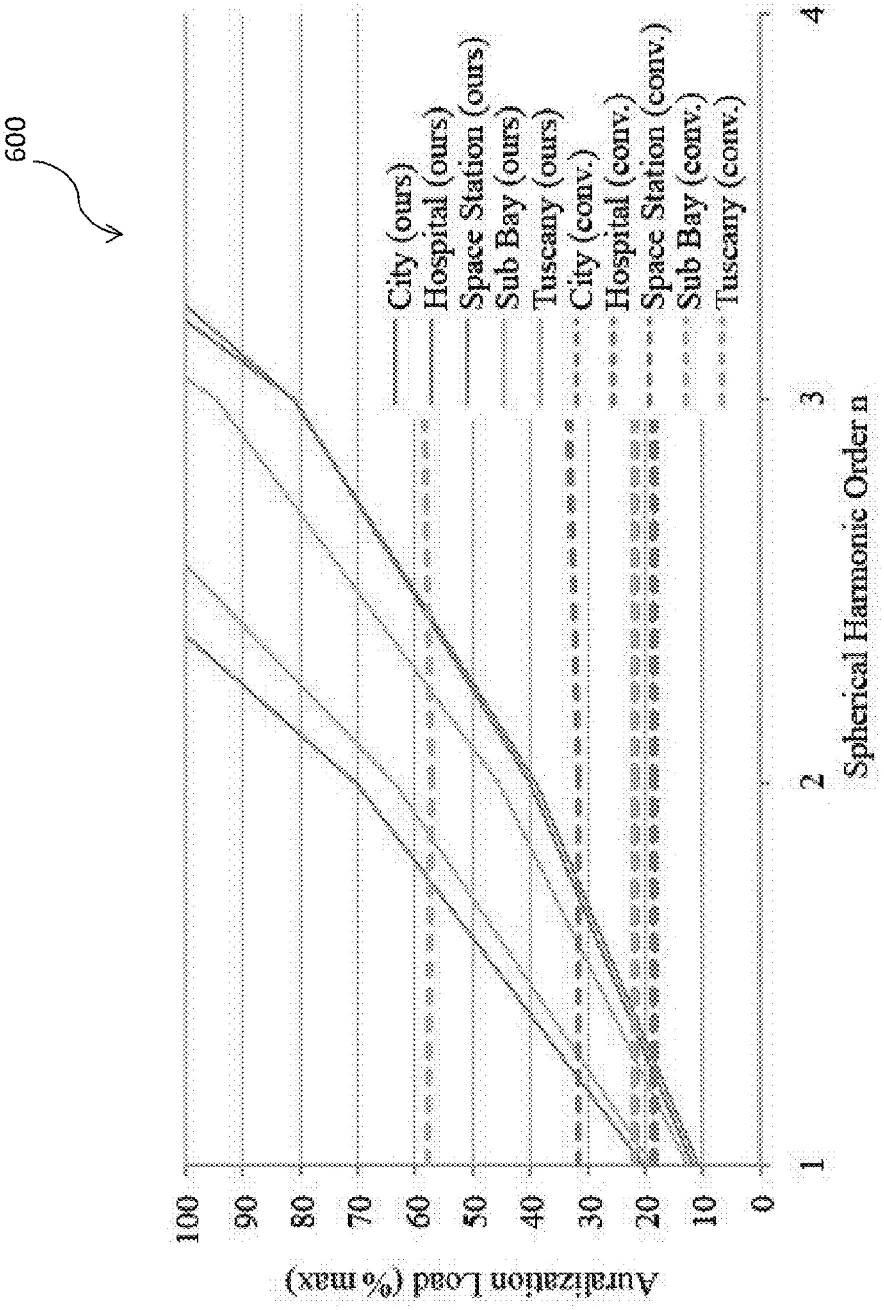
FIG. 6 is a graph illustrating the variance of the performance of an exemplary reverberation rendering algorithm based on the spherical harmonic order used according to an embodiment of the subject matter described herein.

With respect to the auralization performance, the disclosed sound rendering pipeline system uses 11-20% of one thread to render the audio. In comparison, an optimized low-latency convolution system requires about 1.6-3.1× more computation. A significant drawback of convolution is that the computational load is not constant over time, as shown in graph 500 in FIG. 5. Convolution has a much higher maximum computation than the auralization approach and therefore is much more likely to produce audio artifacts due to not meeting real-time requirements. A traditional convolution-based pipeline also requires convolution channels in proportion to the number of sound sources. As a result, convolution becomes impractical for more than a few dozen sound sources. Conversely, the disclosed subject matter uses only a constant number of convolutions per listener for spatialization with the HRTF, where the number of convolutions is $2(n+1)^2$. This means that for SH order n=3, only 32 channels of convolution with a very short HRTF impulse response are rendered, whereas a convolution-based system would have to convolve with an impulse response over 100× longer for each sound source and channel. If not using HRTFs, the disclosed sound rendering pipeline requires no convolutions. The performance of our auralization algorithm is strongly dependent on the spherical harmonic order. In FIG. 6, quadratic scaling for SH orders 1-4 are demonstrated in graph 600. Notably, the disclosed subject matter is faster than convolution-based rendering for n=1, but becomes impractical at higher SH orders. However, reverberation is smoothly directional, so low order spherical harmonics are sufficient to capture most directional effects. In particular, FIG. 6 depicts the rendering performance of a reverberation algorithm utilized by the disclosed sound rendering pipeline system. The rendering performance varies based on the spherical harmonic order used. Quadratic scaling is observed with respect to the SH order. For SH order n=1, the approach is about 2× faster than a convolution based render.

One further advantage of the disclosed sound rendering pipeline system is that the memory required for impulse responses and convolution is greatly reduced. The disclosed sound rendering pipeline stores the IR at 100 Hz sample rate, rather than 44.1 kHz. This provides a memory savings of about 441× for the impulse responses. The disclosed sound rendering pipeline also omits convolution with long impulse responses, which requires at least 3 IR copies for low-latency interpolation. Therefore, this approach uses significant memory for only the delay buffers and reverberator, totaling about 1.6 MB per sound source. This is a total memory reduction of about 10× versus a traditional convolution-based renderer.

Figure 7:
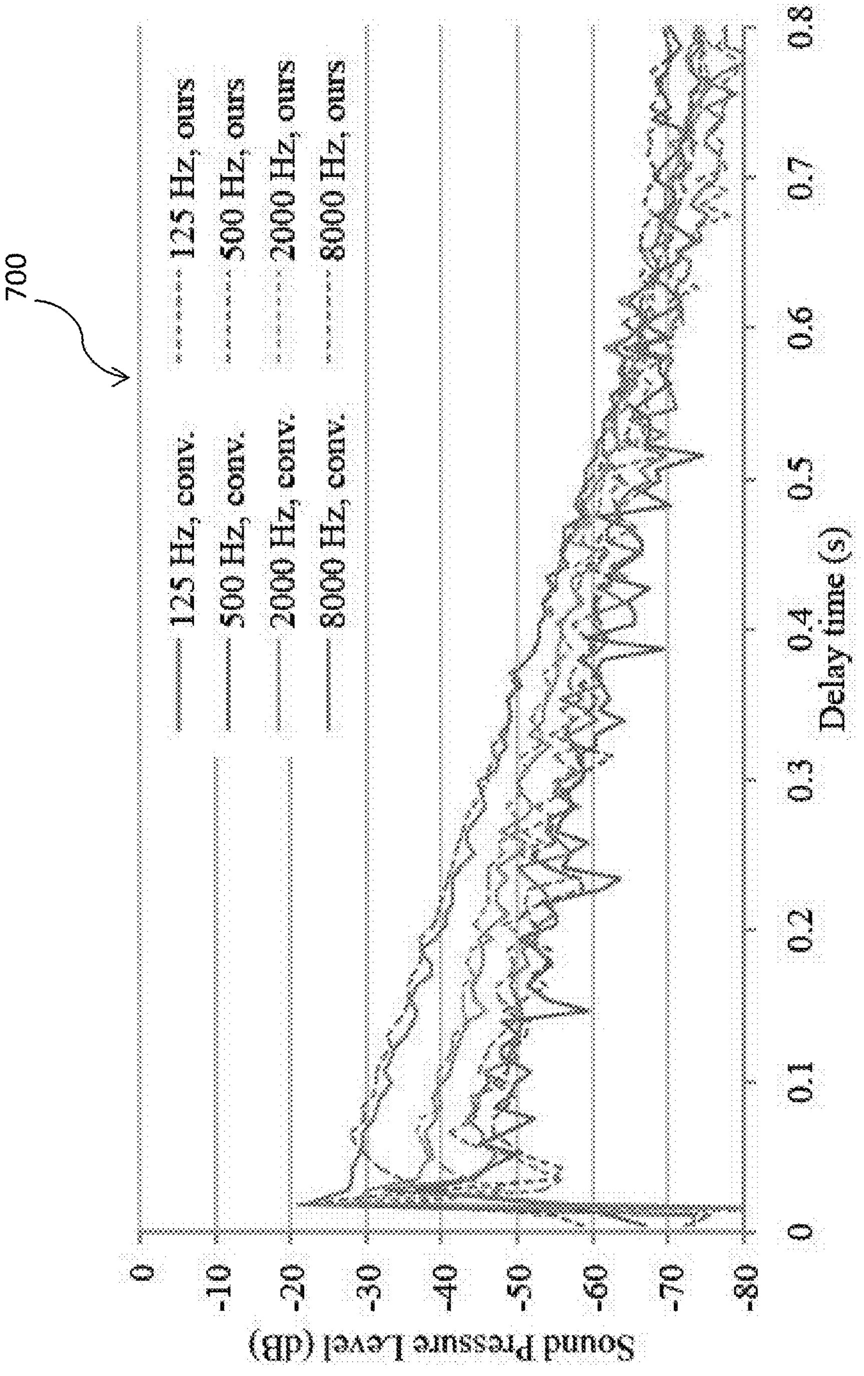
FIG. 7 is a graph illustrating a comparison between an impulse response generated by a spatial reverberation approach and a high-quality impulse response computed via traditional methods according to an embodiment of the subject matter described herein.

In FIG. 7 the impulse response generated by the disclosed sound rendering pipeline is compared to the impulse response generated by a convolution-based sound rendering system in the space station scene. Graph 700 in FIG. 7 shows the envelopes of the pressure impulse response for four frequency bands, which were computed by applying the Hilbert transform to the band-filtered IRs. This approach closely matches the overall shape and decay rate of the convolution impulse response at different frequencies, and preserves the relative levels between the frequencies. In addition, this approach generates direct sound that corresponds to the convolution IR. The average error between the IRs is between 1.2 dB and 3.4 dB across the frequency bands, with the error generally increasing at lower frequencies where there is more noise in the IR envelopes. With respect to standard acoustic metrics like $RT_{60}$, $C_{80}$, $D_{50}$, G, and TS, the disclosed method is very close to the convolution-based method. For $RT_{60}$, the error is in the range of 5-10%, which is close to the just noticeable difference of 5%. For $C_{80}$, a measure of direct to reverberant sound, the error between our method and convolution-based rendering is 0.6-1.3 dB. The error for $D_{50}$ is just 2-10%, while G is within 0.2-0.8 dB. The center time, TS, is off by just 1-7 ms. Overall, the disclosed sound rendering pipeline generates audio that closely matches convolution-based rendering on a variety of comparison metrics.

The disclosed sound rendering pipeline affords a novel sound propagation and rendering architecture based on spatial artificial reverberation. This approach uses a spherical harmonic representation to efficiently render directional reverberation, and robustly estimates the reverberation parameters from a coarsely-sampled impulse response. The result is that this method can generate plausible sound that closely matches the audio produced using more expensive convolution-based techniques, including directional effects. In practice, this approach can generate plausible sound that closely matches the audio generated by state of the art methods based on convolution-based sound rendering pipeline. Its performance has been evaluated on complex scenarios and observe more than an order of magnitude speedup over convolution-based rendering. It is believed that this is the first approach that can generate rendering interactive dynamic physically-based sound on current mobile devices.

Figure 8:
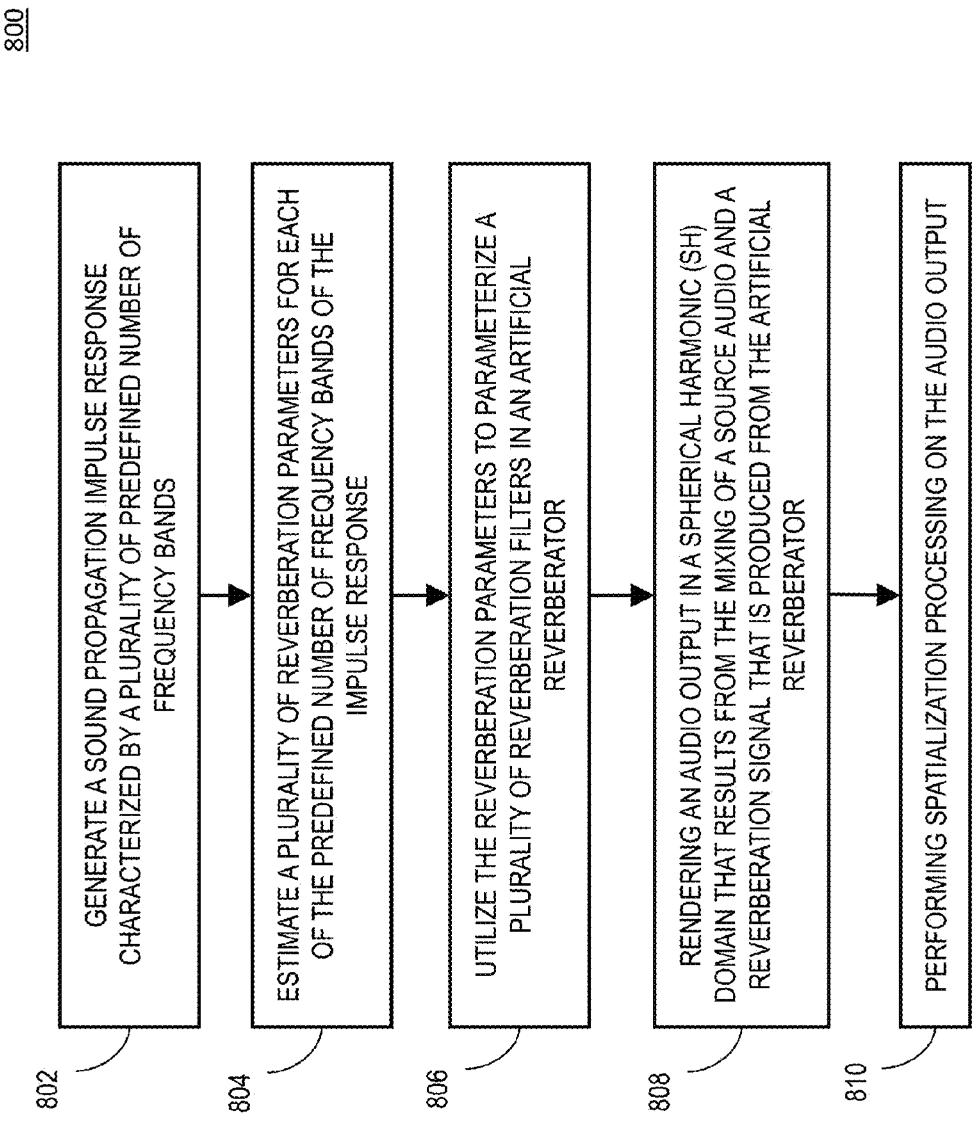
FIG. 8 is a diagram illustrating a method for utilizing ray-parameterized reverberation filters to facilitate interactive sound rendering according to an embodiment of the subject matter described herein.

FIG. 8 is a diagram illustrating a method 800 for utilizing ray-parameterized reverberation filters to facilitate interactive sound rendering according to an embodiment of the subject matter described herein. In some embodiments, method 800 is an algorithm facilitated by components 106-116 (as shown in FIG. 1) or components 204-220 (as shown in FIG. 2) when such components are stored in memory and executed by a processor.

In block 802, a sound propagation impulse response characterized by a plurality of predefined number of frequency bands is generated. In some embodiments, a sound propagation engine on a low power user device (e.g., smartphone) is configured to receive and process scene, listener, and audio source information corresponding to a scene in a virtual environment to generate an impulse response using ray and/or path tracing. Notably, the rays derived by the ray and path tracing are coarsely sampled at a low sample rate (e.g., 100 Hz).

In block 804, a plurality of reverberation parameters for each of the predefined number of frequency bands of the impulse response are estimated. After receiving the IR data from the sound propagation engine, a reverberation parameter estimator is configured to derive a plurality of reverberation parameters. Notably, the IR data received from the sound propagation engine is computed using a small predefined number of sound propagation rays (e.g., 10-100 rays in some embodiments) and thus characterized by a predefined number of frequency bands (due to the coarse sampling).

In block 806, the reverberation parameters are utilized to parameterize plurality of reverberation filters in an artificial reverberator. In some embodiments, the estimated reverberation parameters are provided by the reverberation parameter estimator to an artificial reverberator, such as an SH reverberator. The artificial reverberator may then parameterize its comb filters and/or all pass filters with the received reverberation parameters.

In block 810, an audio output is rendered in a spherical harmonic (SH) domain that results from a mixing of a source audio and a reverberation signal that is produced from the artificial reverberator. In some embodiments, an audio mixing engine is configured to receive a source audio (e.g., from a delay interpolation engine) and a reverberation signal output generated by the parameterized artificial reverberator. The audio mixing engine may then mix the source audio with the reverberation signal to produce a mixed audio signal that is subsequently provided to a spatialization engine. In some embodiments, the artificial reverberator is included in (e.g., contained within) a low power device and the rendering of the audio output does not exceed the computational and power requirements of the low power device.

In block 812, spatialization processing on the audio output is performed. In some embodiments, the spatialization engine receives the mixed audio signal from the audio mixing engine and applies a spatialization technique (e.g., applying a listener's HRFT or applying amplitude panning) to the mixed audio signal to produce a final audio signal, which is ultimately provided to a listener.

It will be understood that various details of the subject matter described herein may be changed without departing from the scope of the subject matter described herein. Furthermore, the foregoing description is for the purpose of illustration only, and not for the purpose of limitation, as the subject matter described herein is defined by the claims as set forth hereinafter.

REFERENCES

The disclosure of each of the following references is incorporated herein by reference in its entirety.

Joseph Anderson and Sean Costello. 2009. Adapting artificial reverberation architectures for B-format signal processing. In *Proc. of the Int. Ambisonics Symposium, Graz, Austria.*

Lakulish Antani and Dinesh Manocha. 2013. Aural proxies and directionally varying reverberation for interactive sound propagation in virtual environments. *IEEE transactions on visualization and computer graphics* 19, 4 (2013), 567-575.

Chunxiao Cao, Zhong Ren, Carl Schissler, Dinesh Manocha, and Kun Zhou. 2016. Interactive sound propagation with bidirectional path tracing. *ACM Transactions on Graphics* (*TOG*) 35, 6 (2016), 180.

Robert D Ciskowski and Carlos Alberto Brebbia. 1991. *Boundary element methods in acoustics*. Springer.

J. J. Embrechts. 2000. Broad spectrum diusion model for room acoustics raytracing algorithms. *The Journal of the Acoustical Society of America* 107, 4 (2000), 2068-2081.

Thomas Funkhouser, Ingrid Carlbom, Gary Elko, Gopal Pingali, Mohan Sondhi, and Jim West. 1998. A beam tracing approach to acoustic modeling for interactive virtual environments. In *Proc. of ACM SIGGRAPH.* 21-32.

William G Gardner. 1994. Efficient convolution without input/output delay. In *Audio Engineering Society Convention* 97. Audio Engineering Society.

William G Gardner. 2002. Reverberation algorithms. In *Applications of digital signal processing to audio and acoustics*. Springer, 85-131.

Michael A. Gerzon. 1973. Periphony: With-Height Sound Reproduction. J. *Audio Eng. Soc* 21, 1 (1973), 2-10. http://www.aes.org/e-lib/browse.cfm?elib=2012

ISO. 2012. ISO 3382, Acoustics—Measurement of room acoustic parameters. *International Standards Organisation* 3382 (2012).

Joseph Ivanic and Klaus Ruedenberg. 1996. Rotation matrices for real spherical harmonics. Direct determination by recursion. *The Journal of Physical Chemistry* 100, 15 (1996), 6342-6347.

Matthias Kronlachner and Franz Zotter. 2014. Spatial transformations for the enhancement of Ambisonic recordings. *In Proceedings of the* 2*nd International Conference on Spatial Audio, Erlangen.*

K Heinrich Kuttruff. 1993. Auralization of impulse responses modeled on the basis of ray-tracing results. *Journal of the Audio Engineering Society* 41, 11 (1993), 876-880.

Tobias Lentz, Dirk Schröder, Michael Vorländer, and Ingo Assenmacher. 2007. Virtual reality system with integrated sound eld simulation and reproduction. *EURASIP journal on applied signal processing* 2007, 1 (2007), 187-187.

R. Mehra, N. Raghuvanshi, L. Antani, A. Chandak, S. Curtis, and D. Manocha. 2013. Wave-Based Sound Propagation in Large Open Scenes using an Equivalent Source Formulation. *ACM Trans. on Graphics* 32, 2 (2013), 19:1-19:13.

Henrik Møller. 1992. Fundamentals of binaural technology. *Applied acoustics* 36, 3-4 (1992), 171-218.

Christian Müller-Tomfelde. 2001. Time varying filter in non-uniform block convolution. In *Proc. of the COST G*-6 *Conference on Digital Audio Effects.*

Ville Pulkki. 1997. Virtual sound source positioning using vector base amplitude panning. *Journal of the Audio Engineering Society* 45, 6 (1997), 456-466.

Boaz Rafaely and Amir Avni. 2010. Interaural cross correlation in a sound field represented by spherical harmonics. *The Journal of the Acoustical Society of America* 127, 2 (2010), 823-828.

Nikunj Raghuvanshi and John Snyder. 2014. Parametric wave field coding for precomputed sound propagation. *ACM Transactions on Graphics* (*TOG*) 33, 4 (2014), 38.

Griffn Romigh, Douglas Brungart, Richard Stern, and Brian Simpson. 2015. Efficient Real Spherical Harmonic Representation of Head-Related Transfer Functions. *IEEE Journal of Selected Topics in Signal Processing* 9, 5 (2015).

Lauri Savioja. 2010. Real-time 3D nite-difference time-domain simulation of low- and mid-frequency room acoustics. In 13*th International Conference on Digital Audio Effects* (*DAFx*-10), Vol. 1. 77-84.

Lauri Savioja and U Peter Svensson. 2015. Overview of geometrical room acoustic modeling techniques. *The Journal of the Acoustical Society of America* 138, 2 (2015), 708-730.

Carl Schissler and Dinesh Manocha. 2016. Adaptive impulse response modeling for interactive sound propagation. In *Proceedings of the* 20*th ACM SIGGRAPH Symposium on Interactive* 3*D Graphics and Games*. ACM, 71-78.

Carl Schissler and Dinesh Manocha. 2016. Interactive Sound Propagation and Rendering for Large Multi-Source Scenes. *ACM Transactions on Graphics* (*TOG*) 36, 1 (2016).

Carl Schissler, Ravish Mehra, and Dinesh Manocha. 2014. High-order diffraction and diffuse reflections for interactive sound propagation in large environments. *ACM Transactions on Graphics* (*SIGGRAPH* 2014) 33, 4 (2014), 39.

Carl Schissler, Aaron Nicholls, and Ravish Mehra. 2016. Efficient HRTF-based Spatial Audio for Area and Volumetric Sources. *IEEE Transactions on Visualization and Computer Graphics* (2016).

Carl Schissler, Peter Stirling, and Ravish Mehra. 2017. Efficient construction of the spatial room impulse response. In *Virtual Reality* (*VR*), 2017 *IEEE*. IEEE, 122-130.

Dirk Schröder, Philipp Dross, and Michael Vorländer. 2007. A fast reverberation estimator for virtual environments. In *Audio Engineering Society Conference: 30th International Conference: Intelligent Audio Environments*. Audio Engineering Society.

Manfred R Schroeder. 1961. Natural sounding artificial reverberation. In *Audio Engineering Society Convention* 13. Audio Engineering Society.

Peter-Pike Sloan. 2008. Stupid spherical harmonics (sh) tricks. In *Game developers conference*, Vol. 9.

Peter-Pike Sloan. 2013. Efficient Spherical Harmonic Evaluation. *Journal of Computer Graphics Techniques* 2, 2 (2013), 84-90.

Uwe M Stephenson. 2010. An energetic approach for the simulation of diffraction within ray tracing based on the uncertainty relation. *Acta Acustica united with Acustica* 96, 3 (2010), 516-535.

Nicolas Tsingos. 2009. Precomputing geometry-based reverberation effects for games. In *Audio Engineering Society Conference: 35th International Conference: Audio for Games*. Audio Engineering Society.

Nicolas Tsingos, Thomas Funkhouser, Addy Ngan, and Ingrid Carlbom. 2001. Modeling acoustics in virtual environments using the uniform theory of diffraction. In *Proceedings of the 28th annual conference on Computer graphics and interactive techniques*. ACM, 545-552.

Vesa Valimaki, Julian D Parker, Lauri Savioja, Julius O Smith, and Jonathan S Abel. 2012. Fifty years of artificial reverberation. *IEEE Transactions on Audio, Speech, and Language Processing* 20, 5 (2012), 1421-1448.

Michael Vorländer. 1989. Simulation of the transient and steady-state sound propagation in rooms using a new combined ray-tracing/image-source algorithm. *The Journal of the Acoustical Society of America* 86, 1 (1989), 172-178.

Pavel Zahorik. 2002. Assessing auditory distance perception using virtual acoustics. *The Journal of the Acoustical Society of America* 111, 4 (2002), 1832-1846.

What is claimed is:

1. A method for utilizing ray-parameterized reverberation filters to facilitate interactive sound rendering, the method comprising:

generating a sound propagation impulse response characterized by a plurality of predefined number of frequency bands;

estimating a plurality of reverberation parameters for each of the predefined number of frequency bands of the impulse response;

utilizing the reverberation parameters to parameterize a plurality of reverberation filters in an artificial reverberator;

rendering an audio output in a spherical harmonic (SH) domain that results from a mixing of a source audio and a reverberation signal that is produced from the artificial reverberator; and performing spatialization processing on the audio output.

2. The method of claim 1 wherein the audio output is spatialized using either a head-related transfer function (HRTF) or amplitude panning.

3. The method of claim 1 wherein the predefined number of frequency bands is determined based on a low sampling rate.

4. The method of claim 1 wherein the reverberation parameters include a time for reverberation decay and a direct-to-reverberant (D/R) sound ratio.

5. The method of claim 1 wherein the artificial reverberator is included in a low power device and the rendering of the audio output does not exceed the computational and power requirements of the low power device.

6. The method of claim 1 wherein the artificial reverberator utilizes spherical harmonic rotations in a comb-filter feedback path to mix SH coefficients and produce a distribution of directivity for the reverberation signal.

7. The method of claim 1 comprising convolving audio input from all sources with a rotated version of a listener's HRTF in the SH domain.

8. A system utilizing ray-parameterized reverberation filters to facilitate interactive sound rendering, the system comprising:

a processor;

a sound propagation engine executable by the processor, the sound propagation engine configured to generate a sound propagation impulse response characterized by a plurality of predefined number of frequency bands;

a reverberation parameter estimator executable by the processor, the reverberation parameter estimator configured to estimate a plurality of reverberation parameters for each of the predefined number of frequency bands of the impulse response;

an artificial reverberator executable by the processor, the artificial reverberator configured to utilize the reverberation parameters to parameterize a plurality of reverberation filters in an artificial reverberator;

an audio mixing engine executable by the processor, the audio mixing engine configured to render an audio output in a spherical harmonic (SH) domain that results from a mixing of a source audio and a reverberation signal that is produced from the artificial reverberator; and a spatialization engine executable by the processor, the spatialization engine configured to perform spatialization processing on the audio output.

9. The system of claim 8 wherein the spatialization engine is configured to spatialize the audio output using either a head-related transfer function (HRTF) or amplitude panning.

10. The system of claim 8 wherein the predefined number of frequency bands is determined based on a low sampling rate.

11. The system of claim 8 wherein the reverberation parameters include a time for reverberation decay and a direct-to-reverberant (D/R) sound ratio.

12. The system of claim 8 wherein the artificial reverberator is included in a low power device and rendering of the audio output does not exceed the computational and power requirements of the low power device.

13. The system of claim 8 wherein the artificial reverberator is further configured to utilize spherical harmonic rotations in a comb-filter feedback path to mix SH coefficients and produce a distribution of directivity for the reverberation signal.

14. The system of claim 8 wherein the spatialization engine is further configured to convolve audio input from all sources with a rotated version of a listener's HRTF in the SH domain.

15. A non-transitory computer readable medium having stored thereon executable instructions that when executed by a processor of a computer control the computer to perform steps comprising:

generating a sound propagation impulse response characterized by a plurality of predefined number of frequency bands;

estimating a plurality of reverberation parameters for each of the predefined number of frequency bands of the impulse response;

utilizing the reverberation parameters to parameterize a plurality of reverberation filters in an artificial reverberator;

rendering an audio output in a spherical harmonic (SH) domain that results from a mixing of a source audio and a reverberation signal that is produced from the artificial reverberator; and performing spatialization processing on the audio output.

16. The non-transitory computer readable medium of claim 15 wherein the audio output is spatialized using either a head-related transfer function (HRTF) or amplitude panning.

17. The non-transitory computer readable medium of claim 15 wherein the predefined number of frequency bands is determined based on a low sampling rate.

18. The non-transitory computer readable medium of claim 15 wherein the reverberation parameters include a time for reverberation decay and a direct-to-reverberant (D/R) sound ratio.

19. The non-transitory computer readable medium of claim 15 wherein the artificial reverberator is included in a low power device and the rendering of the audio output does not exceed the computational and power requirements of the low power device.

20. The non-transitory computer readable medium of claim 15 wherein the artificial reverberator utilizes spherical harmonic rotations in a comb-filter feedback path to mix SH coefficients and produce a distribution of directivity for the reverberation signal.

* * * * *